(12) United States Patent
Sohn

(10) Patent No.: US 8,531,327 B2
(45) Date of Patent: Sep. 10, 2013

(54) ANALOG TO DIGITAL CONVERTER

(75) Inventor: Young Chul Sohn, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 67 days.

(21) Appl. No.: 13/293,306

(22) Filed: Nov. 10, 2011

(65) Prior Publication Data

US 2012/0112940 A1  May 10, 2012

(30) Foreign Application Priority Data

Nov. 10, 2010  (KR) .......................... 10-2010-0111659

(51) Int. Cl.
*H03M 1/58* (2006.01)

(52) U.S. Cl.
USPC .......................................... 341/170; 341/155

(58) Field of Classification Search
USPC .................. 341/155, 166, 169, 170
See application file for complete search history.

(56) References Cited

U.S. PATENT DOCUMENTS

| | | | |
|---|---|---|---|
| 7,777,170 B2 * | 8/2010 | Murakami et al. | 250/208.1 |
| 8,350,941 B2 * | 1/2013 | Kukita | 348/308 |
| 8,358,361 B2 * | 1/2013 | Hasegawa | 348/300 |
| 8,390,486 B2 * | 3/2013 | Wang et al. | 341/118 |
| 2006/0028360 A1 | 2/2006 | Tittel | |

FOREIGN PATENT DOCUMENTS

| KR | 1020000014964 A | 3/2000 |
|---|---|---|
| KR | 1020010001834 A | 1/2001 |
| KR | 1020070058488 A | 6/2007 |
| KR | 1020080007713 A | 1/2008 |

\* cited by examiner

*Primary Examiner* — Brian Young
(74) *Attorney, Agent, or Firm* — William Park & Associates Patent Ltd.

(57) ABSTRACT

An analog to digital converter (ADC) includes a clock control unit supplying a predetermined clock signal corresponding to luminance among a plurality of clock signals having different frequencies; and a signal conversion unit comparing a ramp signal with an inputted pixel signal to generate a comparison result signal. The ADC performs counting corresponding to the predetermined clock signal supplied by the clock control unit and stores a count value counted at a time of the generating of the comparison result signal.

8 Claims, 6 Drawing Sheets

US 8,531,327 B2

ANALOG TO DIGITAL CONVERTER

CROSS-REFERENCE TO RELATED APPLICATIONS

This application claims priority to Korean Patent Application No. 10-2010-0111659 filed on Nov. 10, 2010, in the Korean Intellectual Property Office, the disclosure of which is incorporated herein by reference in its entirety.

BACKGROUND OF THE INVENTION

1. Field of the Invention

The present invention relates generally to an analog to digital converter, and more particularly to a single slope analog to digital converter for an image sensor.

2. Description of the Related Art

In general, a charge coupled device (CCD) and a CMOS image sensor (CIS) are widely in use as image pickup devices for converting an optical image into an electrical signal.

Manufacturing a CMOS image sensor through a general CMOS process is considered more economical than manufacturing an image pickup device using a CCD, as a CMOS image sensor as an analog to digital converting device can be integrated in a single chip. In addition, a CMOS image sensor is more suitable for low voltage and low power consumption design needed in various mobile applications such as the mobile phones, digital cameras, etc.

A CMOS image sensor may require a high resolution analog to digital converting device for converting an analog signal outputted from an active pixel sensor (APS), reactive to light, into a digital signal.

Analog to digital conversion in a CMOS image sensor may be performed on a chip unit, a column unit, or a pixel unit. A column type analog to digital converter, in which analog to digital conversion is performed on a column unit, is widely in use for commercial purposes due to many advantages related to frame speed, resolution, power consumption, and extensibility.

FIG. 1 shows a single slope analog to digital converter (ADC) 10 according to the related art, and FIG. 2 is a graph related to the operation of the single slope ADC 10 shown in FIG. 1.

Referring to FIGS. 1 and 2, the single slope ADC 10 may include a ramp signal generating unit 11, a comparator 13, a pulse generating unit 15, a counter 17 and a register 19.

The comparator 13 compares a pixel signal Vsig from a pixel in a pixel array with a ramp signal Vramp from the ramp signal generating unit 11 and outputs a comparison result signal Comp. The ramp signal Vramp may decrease or increase with a preset slope.

The pulse generating unit 15 generates a very short pulse signal Pulse_out based on the comparison result signal Comp outputted from the comparator 13 and supply the pulse signal Pulse_out to the register 19.

The counter 17 begins counting according to a preset frequency of a clock signal CLK simultaneously while the comparator 13 is performing the comparing operation, and the count value of the counter 17 is supplied to the register 19.

The register 19 latches and stores the count value received from the counter 17 at the time the pulse signal Pulse_out is received from the pulse generating unit 15.

The above-mentioned single slope ADC of the related art performs the linear analog to digital conversion regardless of the voltage level of a pixel signal, and as such it is unable to perform a conversion optimized for human visual perceptual characteristics.

That is, even through human eyes are generally sensitive in low luminance conditions and insensitive in high luminance conditions, the single slope ADC according to the related art may perform a linear signal conversion to cause the omission of data in low luminance conditions and the saturation of data in high luminance conditions, such that a dynamic range in an image sensor may be reduced.

SUMMARY OF THE INVENTION

An aspect of the present invention provides an analog to digital converter performing an analog to digital conversion, optimized for human visual perceptual characteristics and allowing for a wide dynamic range; however, it is not limited thereto and other aspects of the present invention will be apparent to a person having ordinary skill in the art, from the following description.

According to an aspect of the present invention, there is provided an analog to digital converter (ADC), including: a clock control unit supplying a predetermined clock signal corresponding to luminance, among a plurality of clock signals having different frequencies; and a signal conversion unit comparing a ramp signal with an inputted pixel signal to generate a comparison result signal, performing counting corresponding to the predetermined clock signal supplied by the clock control unit, and storing a count value counted at a time of the generating of the comparison result signal.

According to another aspect of the present invention, there is provided an analog to digital converter (ADC), including: a clock control unit performing frequency division on a clock signal having a specific frequency with a predetermined frequency according to luminance, and supplying the clock signal having the predetermined frequency; and a signal conversion unit comparing a ramp signal with an inputted pixel signal to generate a comparison result signal, performing counting corresponding to the clock signal having the predetermined frequency supplied by the clock control unit, and storing a count value counted at the time of the generating of the comparison result signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
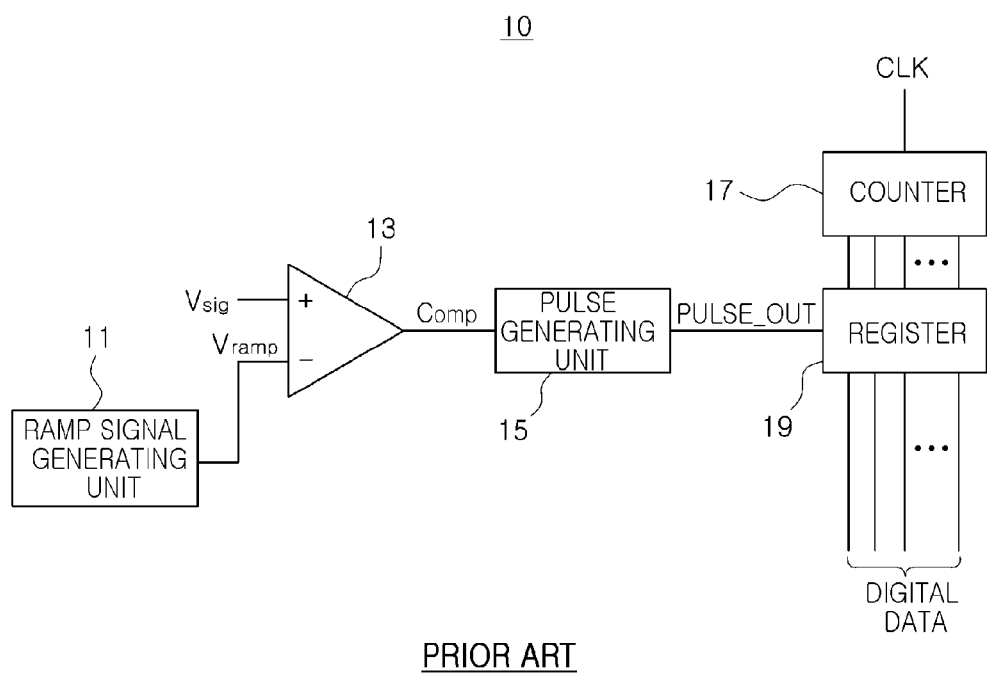
FIG. 1 shows a single slope analog to digital converter (ADC) according to the related art.
Figure 2:
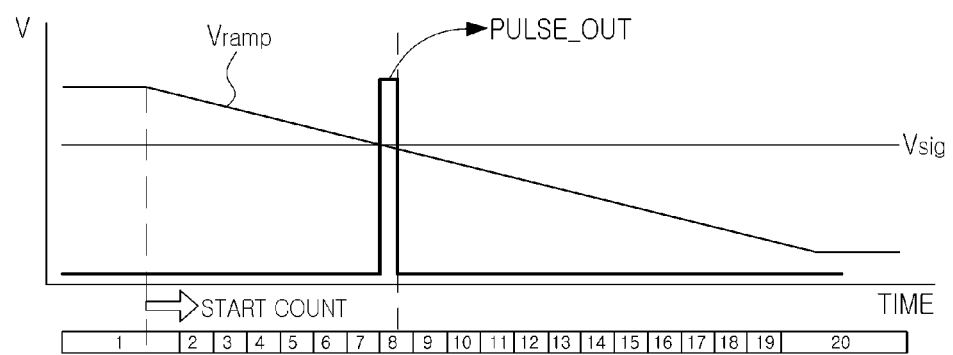
FIG. 2 shows a graph related to an operation of the single slope ADC illustrated in FIG. 1.

The present invention may be variably modified and may have various embodiments, particular examples of which will be illustrated in drawings and described in detail.

However, it should be understood that the following exemplifying description of the invention is not intended to restrict the invention to specific forms of the present invention but rather the present invention is meant to cover all modifications, similarities and alternatives which are included in the spirit and scope of the present invention.

While terms such as "first" and "second," etc., may be used to describe various components, such components must not be understood as being limited to the above terms. The above terms are used only to distinguish one component from another. For example, a first component may be referred to as a second component without departing from the scope of rights of the present invention, and likewise a second component may be referred to as a first component. The term "and/or" encompasses both combinations of the plurality of related items disclosed and any item from among the plurality of related items disclosed.

When a component is mentioned as being "connected" to or "accessing" another component, this may mean that it is directly connected to or accessing the other component, but it is to be understood that another component may exist therebetween. On the other hand, when a component is mentioned as being "directly connected" to or "directly accessing" another component, it is to be understood that there are no other components in-between.

The terms used in the present application are merely used to describe particular embodiments, and are not intended to limit the present invention. An expression used in the singular encompasses the expression of the plural, unless it has a clearly different meaning in the context. In the present application, it is to be understood that terms such as "including" or "having," etc., are intended to indicate the existence of features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms used herein, including technical or scientific terms, have the same meanings as those generally understood by those having ordinary knowledge in the field of art to which the present invention pertains. Such terms as those defined in a generally used dictionary are to be interpreted as having meanings equal to the contextual meanings in the relevant field of art, and are not to be interpreted as having ideal or excessively formal meanings, unless clearly defined as having such in the present application.

Embodiments of the present invention will be described below in detail with reference to the accompanying drawings. In order to facilitate an overall understanding in describing the present invention, the same or equivalent elements are referred to by the same reference numerals throughout the specification.

Figure 3:
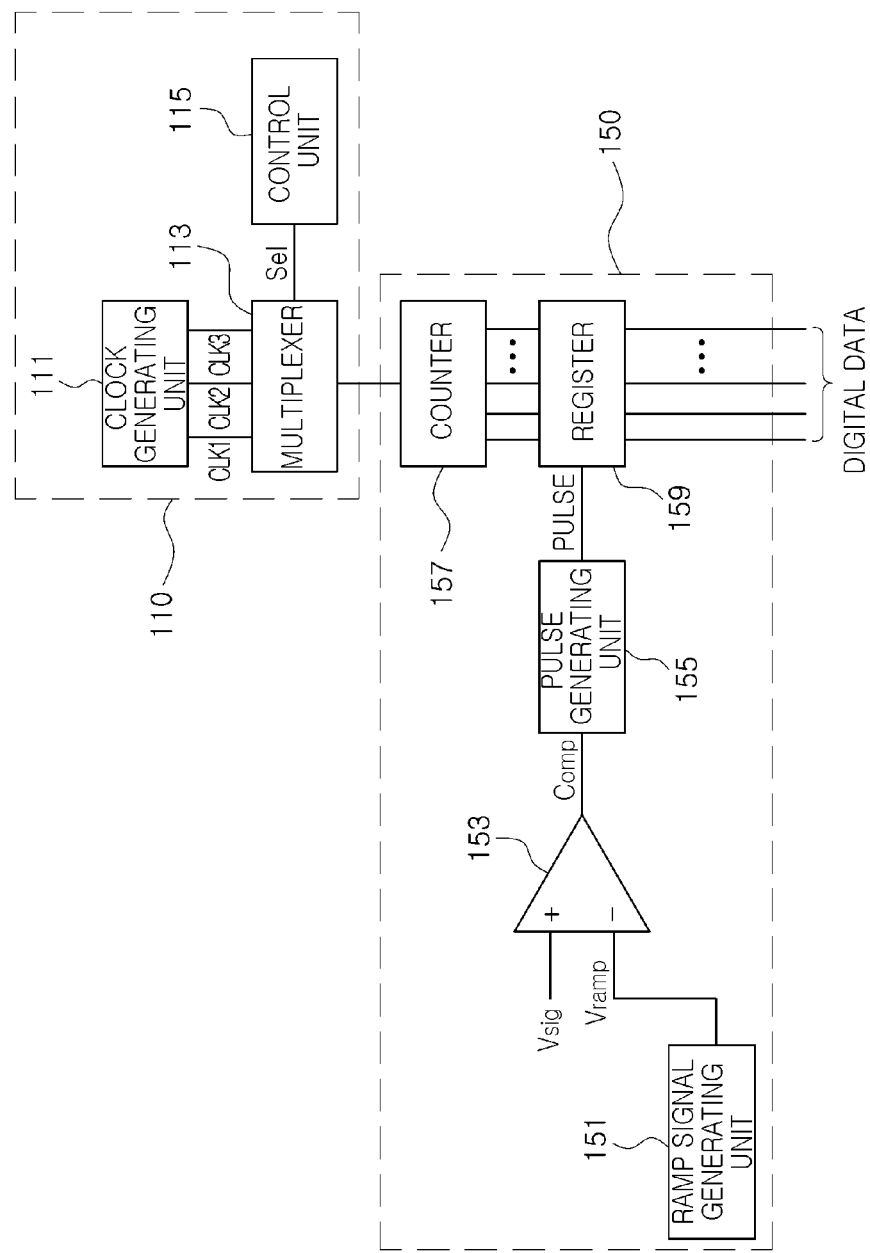
FIG. 3 shows an analog to digital converter according to an embodiment of the present invention.
Figure 4:
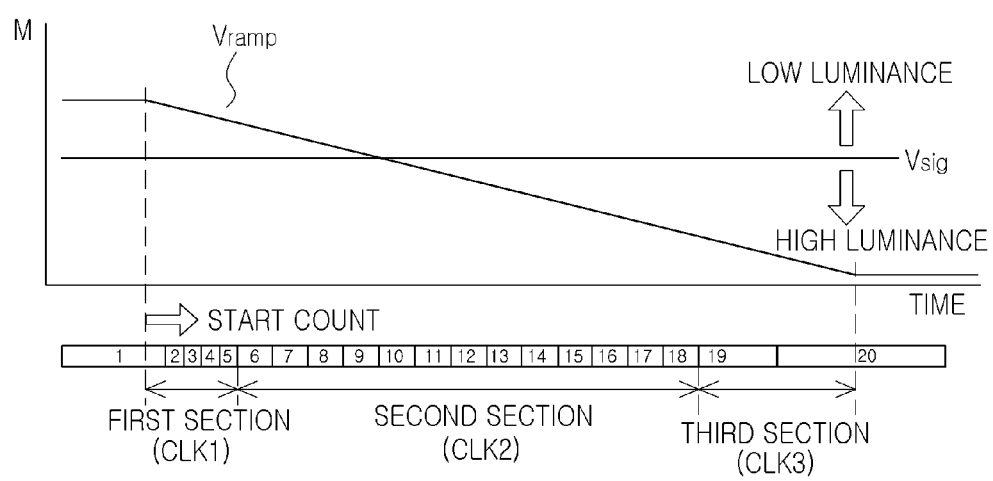
FIG. 4 shows a timing diagram related to an operation of the analog to digital converter illustrated in FIG. 3.

FIG. 3 is a block configuration diagram of an analog to digital converter according to an embodiment of the present invention. FIG. 4 is a timing diagram illustrating an operation of the analog to digital converter illustrated in FIG. 3.

Referring to FIGS. 3 and 4, an analog to digital converter 100 may include a clock control unit 110 and a signal conversion unit 150.

The clock control unit 110 is configured to supply one of a plurality of clock signals having different frequencies to the signal conversion unit 150 according to the luminance of a pixel or the magnitude of a pixel signal, for example, the pixel voltage.

The signal conversion unit 150 is configured to compare a preset ramp signal Vramp with a pixel signal Vsig inputted from a pixel array (not shown) to generate a comparison result signal Comp. The counter 157 perform counting based on the clock signal supplied by the clock control unit 110, and the count value is stored in the register 159 at the time the comparison result signal is generated by the pulse generating unit 155.

The clock control unit 110 may include a clock generating unit 111, a multiplexer 113, and a control unit 115.

The clock generating unit 111 is configured to generate a plurality of clock signals CLK1, CLK2, and CLK3 having different frequencies, which are to be inputted to the multiplexer 113.

The multiplexer 113 may be provided between the clock generating unit 111 and a counter 157 to supply the counter 157 with any one of the plurality of clock signals CLK1, CLK2, and CLK3 supplied by the clock generating unit 111 in resonse to a selection control signal Sel from the control unit 115.

Corresponding to a preset level of luminance, the control unit 115 is configured to supply the multiplexer 113 with the selection control signal Sel, to thereby control the selection operation of the multiplexer 113. For example, when the resolution of the analog to digital converter 100 is supposed to be 10 bits and when three clock frequencies CLK1, CLK2, CLK3 are supposed to be generated by the clock generating unit 111, any one of clock signals CLK1, CLK2, CLK3 having different frequencies is supplied to the counter 157 according to luminance of the pixel. The counter 157 performs counting in correspondence with the provided one of the clock signals CLK1, CLK2, and CLK3. The counter 157 may perform the counting operations based on a predetermined number of count sections (for example, three count sections) that are based on the luminance of the pixel. The control unit 115 supplies the multiplexer 113 with the selection control signal Sel so as to control the selection operation of the multiplexer 113, in order that an appropriate one of the clock signals having different frequencies CLK1, CLK2, CLK3 is supplied to the counter 157 during each periods of the predetermined number of the count sections (e.g., respective luminance sections).

For example, as illustrated in FIG. 4, the total count section may be divided into three sections (i.e., a first section, a second section, and a third section) in the order of low luminance to high luminance, and three clock signals (i.e., CLK1, CLK2, CLK3) may be generated in the order of high frequency to low frequency. The control unit 115 provides the selection control signal Sel to control the selection operation of the multiplexer 113. That is, during the first section of the lowest luminance, the first clock signal CLK1 having the highest frequency may be supplied to the counter 157. During the second section in which the luminance is higher than the first section, the second clock signal CLK2 having a frequency lower than the first clock signal CLK1 frequency may be supplied to the counter 157. During the third section of the highest luminance, the third clock signal CLK3 having the frequency even lower than the second clock signal CLK2 frequency may be supplied to the counter 157. Accordingly, a faster counting is performed so as to increase the sensitivity in low luminance conditions, and a slower counting is performed so as to lower sensitivity in high luminance conditions, so as to perform an analog to digital conversion that is more suitable for human visual perceptual characteristics.

Referring back to FIG. 3, the signal conversion unit 150 may include a ramp signal generating unit 151, a comparing unit 153, a pulse generating unit 155, the counter 157, and a register 159.

The ramp signal generating unit 151 may generate a ramp signal Vramp having a preset slope and supply the ramp signal Vramp to the comparing unit 153.

The comparing unit 153 may compare the ramp signal Vramp from the ramp signal generating unit 151 with a pixel signal Vsig corresponding to a pixel of the pixel array and output a comparison result signal Comp.

The pulse generating unit 155 generates a pulse signal Pulse when the comparison result signal Comp is outputted from the comparing unit 153 and supply the generated pulse signal Pulse to the register 159.

The counter 157 is configured to perform counting corresponding to one of the clock frequencies supplied from the multiplexer 113 and supply the counting value to the register 159. The counter 157 may perform the counting with a preset bit number, for example, 10 bits.

The register 159 latches and stores the count value supplied from the counter 157 when the pulse signal Pulse is received from the pulse generating unit 155.

According to an embodiment of the present invention, it is not necessary to include the pulse generating unit 155 in the analog to digital converter 100. When the analog to digital converter 100 does not include the pulse generating unit 155, an output from the comparing unit 153 may be directly supplied to the register 159, and the register 159 may be synchronized with a rising edge or falling edge of the output from the comparing unit 153 to store the count value supplied by the counter 157.

Figure 5:
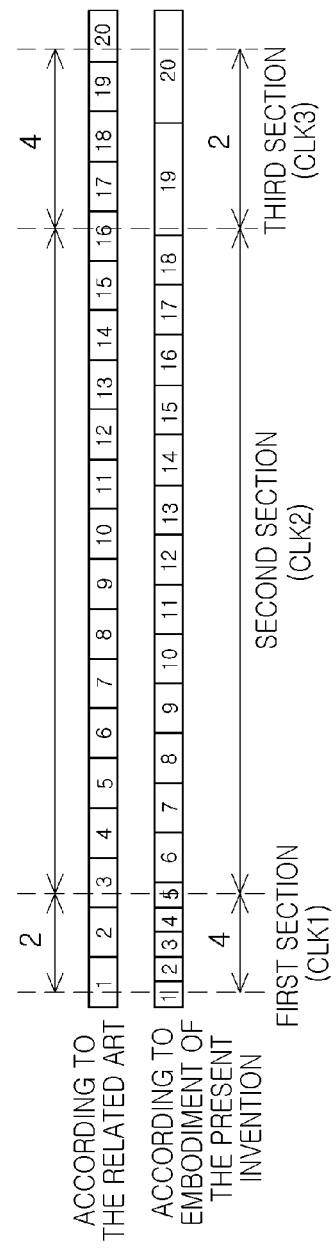
FIG. 5 shows a timing diagram related to comparing the two example operations of the two analog to digital converters shown in FIGS. 1 and 3.

FIG. 5 is a timing diagram for comparing the operations of the analog to digital converter according to an embodiment of the present invention as illustrated in FIG. 3 and the analog to digital converter of the prior art as shown in FIG. 1.

Referring to FIG. 5, during the first section of the low luminance, there are four count values accumulated in the analog to digital converter according to an embodiment of the present invention, whereas two count values are accumulated in the analog to digital converter according to the related art.

That is, according to an embodiment of the present invention, four digital values (as opposed to two digital values in the case of prior art) are represented in the analog to digital converter with respect to the pixel signal during the first section having the lowest luminance. This produces more precise image in low luminance conditions than the image produced by the analog to digital converter of the related art. Therefore, the analog to digital converter according to an embodiment of the present invention may perform a signal conversion more suitable for human visual perceptual characteristics.

In addition, during the third section of the high luminance, there are two count values accumulated in the analog to digital converter according to an embodiment of the present invention, whereas four count values are accumulated in the analog to digital converter according to the related art.

In general, human eyes are insensitive in high luminance conditions. Thus, even though a signal conversion in high luminance conditions is performed so as to have high sensitivity as in the analog to digital converter according to the related art, human eyes may not recognize a distinction between high sensitivity and low sensitivity in high luminance conditions to thereby consequently leading to data dissipation.

Therefore, as illustrated in FIG. 5, the analog to digital converter according to an embodiment of the present invention may perform an analog to digital conversion with high sensitivity in low luminance conditions (e.g., the first section) and perform an analog to digital conversion with low sensitivity in high luminance conditions (e.g., the third section), to thereby allow for a wide dynamic range and perform a signal conversion optimized for human visual perceptual characteristics.

Figure 6:
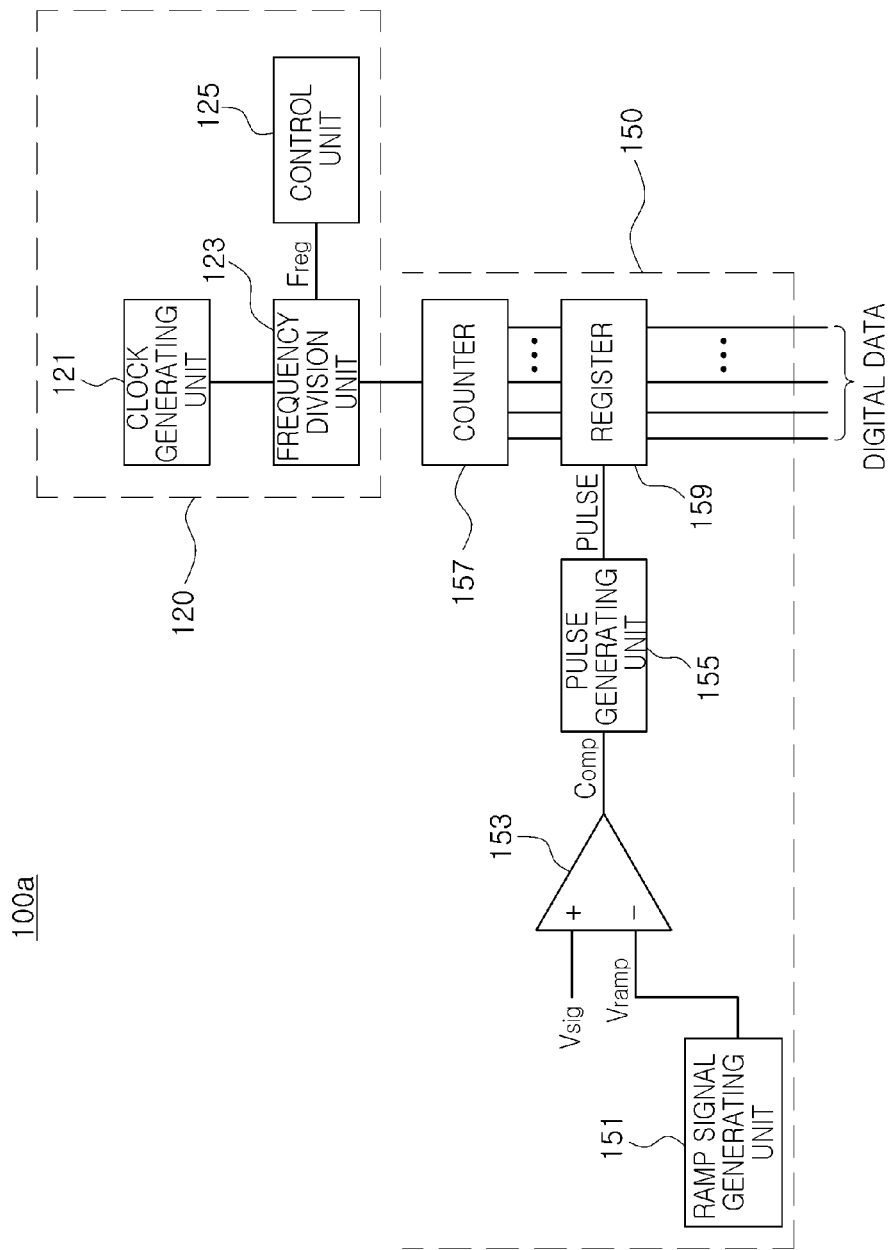
FIG. 6 shows a variation of an analog to digital converter according to an embodiment of the present invention.

FIG. 6 shows a variation of an analog to digital converter according to an embodiment of the present invention.

Referring to FIG. 6, an analog to digital converter 100a according to an embodiment of the present invention may include a clock control unit 120 and a signal conversion unit 150.

The clock control unit 120 may supply the signal conversion unit 150 with a clock signal having one of a plurality of clock frequencies according to luminance.

The signal conversion unit 150 is configured to compare a preset ramp signal with a pixel signal Vsig inputted from a pixel array (not shown) to generate a comparison result signal Comp. The counter 157 performs the counting operation based on the clock signal supplied by the clock control unit 120 and stores the count value in the register 159 that was counted at the time the comparison result signal Comp is generated.

The clock control unit 120 according to an embodiment of the present invention may include a clock generating unit 121, a frequency division unit 123, and a control unit 125.

The clock generating unit 121 is configured to generate a clock signal having a preset frequency and supply the clock signal having the preset frequency to the frequency division unit 123.

The frequency division unit 123 is configured to receive a frequency division control signal from the control unit 125 and perform a frequency division operation on the clock signal having the preset frequency received from the clock generating unit 121. The preset frequency of the received clock signal is divided to a predetermined ratio so as to output a frequency divided clock signal CLKn to the counter 157. The frequency division unit 123 is configured to perform a frequency division operation on the clock signal having a preset frequency at one of various ratios in correspondence with the frequency division control signal Freq outputted by the control unit 125.

The control unit 125 may correspond to a preset level of luminance and supply the frequency division unit 123 with the frequency division control signal Freq, to thereby control the frequency division operation of the frequency division unit 123. When the resolution of the analog to digital converter 100a is, for example, 10 bits and the counter 157 performs counting according to, for example, three clock signals having different frequencies according to luminance, the total count section may be divided into three count sections based on the luminance, and the control unit 125 may supply the frequency division unit 123 with the frequency division control signal Freq to control the frequency division operation of the frequency division unit 123, in order that the clock signals having different frequencies may be supplied to the counter 157 during the respective divided count sections relating to the respective luminance sections.

For example, as illustrated in FIG. 4, the total count section may be divided into a first section, a second section, and a third section in the order of low luminance to high luminance. During the first section relating to the lowest luminance, the control unit 125 is configured to supply the frequency division unit 123 with the frequency division control signal Freq to control the frequency division operation of the frequency division unit 123, in order that the first clock signal having the highest frequency is supplied to the counter 157. During the second section relating the luminance higher than the first section but lower than the third section, the control unit 125 is configured to provide the second clock signal having a frequency lower than that of the first clock signal to the counter 157. During the third section relating to the highest luminance, the control unit 125 is configured to provide the third clock signal having a frequency even lower than that of the second clock signal to the counter 157. Accordingly, faster counting is performed so as to increase sensitivity in low luminance and slower counting is performed so as to lower sensitivity in high luminance, thereby performing the analog to digital conversion that is more suited for human visual perceptual characteristics.

Referring again to FIG. 6, the signal conversion unit 150 may include the ramp signal generating unit 151, the comparing unit 153, the pulse generating unit 155, the counter 157, and the register 159.

The ramp signal generating unit 151 is configured to generate the ramp signal Vramp having a preset slope and supply the ramp signal Vramp to the comparing unit 153.

The comparing unit 153 is configured to compare the ramp signal Vramp supplied by the ramp signal generating unit 151 with the pixel signal Vsig supplied by the corresponding pixel of the pixel array to output the comparison result signal Comp.

The pulse generating unit 155 is configured to generate the pulse signal Pulse based on the comparison result signal Comp outputted from the comparing unit 153 and supply the generated pulse signal Pulse to the register 159.

The counter 157 is configured to perform counting according to the frequency of the clock signal CLKn supplied by the frequency division unit 123 and output a count value to the register 159. The counter 157 may perform counting with a preset bit number, for example, 10 bits.

The register 159 may latch and store the count value supplied by the counter 157 at the time the pulse signal Pulse is generated from the pulse generating unit 155.

According to an embodiment of the present invention, it would not be necessary for the analog to digital converter 100a to include the pulse generating unit 155. When a pulse generating unit such as 155 is not included in the analog to digital converter 100a, an output from the comparing unit 153 may be directly supplied to the register 159, and the register 159 may be synchronized with a rising edge or falling edge of the output from the comparing unit 153 to store the count value supplied by the counter 157.

As set forth above, the analog to digital converter according to various embodiments of the present invention, a clock signal having a higher frequency is supplied to a counter to allow for the performing of counting at a higher rate in a lower luminance condition, and a clock signal having lower frequency is supplied to the counter to allow for the performing of counting at a slower rate in a higher luminance condition, whereby an analog to digital conversion may be performed with high sensitivity in low luminance conditions while performing the analog to digital conversion with low sensitivity in high luminance conditions.

Therefore, a photographed image may be more finely and precisely indicated in low luminance conditions in which human eyes react sensitively and a photographed image may be simply indicated in high luminance conditions in which human eyes react insensitively, whereby an analog to digital conversion optimized for human visual perceptual characteristics may be performed and a widened dynamic range may be obtained.

While the present invention has been shown and described in connection with the embodiments, it will be apparent to those skilled in the art that modifications and variations can be made without departing from the spirit and scope of the invention as defined by the appended claims.

What is claimed is:

1. An analog to digital converter (ADC), comprising:
a clock control unit configured to provide an operating clock signal having an operating frequency corresponding to a luminance condition,
wherein the operating frequency is set to a higher frequency for a lower luminance condition and to a lower frequency for a higher luminance condition; and
a signal conversion unit configured to generate a count value corresponding to an inputted pixel signal, wherein the counting is performed according to the operating frequency during an overall count section of a predetermined duration,
wherein the overall count section during which counting is performed includes at least two subsections such that the operating frequency provided in one subsection is different from another subsection,
wherein the operating clock signal having the operating frequency to be provided in each subsection is selected from one or a plurality of clock signals having different frequencies,
wherein the signal conversion unit comprises:
a ramp signal generating unit generating a ramp signal having a predetermined slope;
a comparing unit comparing the ramp signal with an inputted pixel signal to output a comparison result signal;
a counter counting according to the operating frequency and storing a count value counted at a time of the generating of the comparison result signal; and
wherein the signal conversion unit further comprises:
a pulse generating unit receiving the comparison result signal from the comparing unit and outputting a pulse at the time of generating of the comparison result signal to store the count value in a register.

2. The analog to digital converter (ADC) of claim 1,
wherein the overall count section is divided into a plurality of subsection based on the luminance condition of each subsection, and
wherein a first frequency selected as the operating frequency for a first subsection is higher than a second frequency selected as the operating frequency for a second subsection when luminance of the first subsection is lower than the luminance of the second subsection.

3. An analog to digital converter (ADC) comprising:
a clock control unit configured to provide an operating clock signal having an operating frequency corresponding to a luminance condition,
wherein the operating frequency is set to a higher frequency for a lower luminance condition and to a lower frequency for a higher luminance condition; and
a signal conversion unit configured to generate a count value corresponding to an inputted pixel signal, wherein the counting is performed according to the operating frequency during an overall count section of a predetermined duration,
wherein the overall count section during which counting is performed includes at least two subsections such that the operating frequency provided in one subsection is different from another subsection,
wherein the operating clock signal having the operating frequency to be provided in each subsection is selected from one of a plurality of clock signals having different frequencies,
wherein the signal conversion unit comprises:
a ramp signal generating unit generating a ramp signal having a predetermined slope;

a comparing unit comparing the ramp signal with an inputted pixel signal to output a comparison result signal;

a counter counting according to the operating frequency and storing a count value counted at a time of the generating of the comparison result signal; and wherein the overall count section is divided into a plurality of subsection based on the luminance condition of each subsection, and wherein a first frequency selected as the operating frequency for a first subsection is higher than a second frequency selected as the operating frequency for a second subsection when luminance of the first subsection is lower than the luminance of the second subsection.

wherein the clock control unit comprises:

a clock generating unit generating the plurality of clock signals having different frequencies;

a control unit outputting a selection control signal according to luminance; and a multiplexer receiving the plurality of clock signals having different frequencies, selecting one of the plurality of clock signals having different frequencies as the operating signal based on the selection control signal, and outputting the selected clock signal.

4. The analog to digital converter (ADC) of claim 3, wherein the signal conversion unit includes:

a ramp signal generating unit generating a ramp signal having a predetermined slope;

a comparing unit comparing the ramp signal with the inputted pixel signal to output the comparison result signal;

a counter counting according to the operating frequency of the operating clock signal received from the multiplexer; and a register storing a count value supplied by the counter at the time of the generating of the comparison result signal.

5. The analog to digital converter (ADC) of claim 1, wherein the operating frequency of the operating clock signal is varied by frequency dividing the operating clock signal.

6. The analog to digital converter (ADC) of claim 5, wherein the overall count section is divided into a plurality of subsection based on the luminance condition of each subsection, and wherein the operating frequency is varied to a first frequency for a first subsection and varied to a second frequency for a second subsection when luminance of the first subsection is lower than the luminance of the second subsection such that the first frequency is higher than the second frequency.

7. The analog to digital converter (ADC) of claim 6, wherein the clock control unit comprises:

a clock generating unit generating an initial clock signal having an initial frequency;

a control unit outputting a frequency division control signal according to luminance;

a frequency division unit receiving the initial clock signal having the initial frequency, frequency diving the initial clock signal according to the frequency division control signal, and outputting the frequency divided initial clock signal as the operating frequency of the operating signal.

8. The analog to digital converter (ADC) of claim 7, wherein the signal conversion unit includes:

a ramp signal generating unit generating a ramp signal having a predetermined slope;

a comparing unit comparing the ramp signal with the inputted pixel signal to output the comparison result signal;

a counter counting according to the operating frequency received from the frequency division unit; and a register storing a count value supplied by the counter at the time of the generating of the comparison result signal.

* * * * *